(12) United States Patent
Oh

(10) Patent No.: US 12,726,559 B2
(45) Date of Patent: Sep. 1, 2026

(54) DISPLAY DEVICE

(71) Applicant: LG Display Co., Ltd., Seoul (KR)

(72) Inventor: Jae Young Oh, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 686 days.

(21) Appl. No.: 17/548,211

(22) Filed: Dec. 10, 2021

(65) Prior Publication Data

US 2022/0208937 A1 Jun. 30, 2022

(30) Foreign Application Priority Data

Dec. 29, 2020 (KR) ........................ 10-2020-0186848

(51) Int. Cl.

| | |
|---|---|
| ***H04M 1/02*** | (2006.01) |
| ***H10K 59/131*** | (2023.01) |
| *H10K 59/122* | (2023.01) |
| *H10K 59/124* | (2023.01) |
| *H10K 59/80* | (2023.01) |
| *H10K 77/10* | (2023.01) |

(52) U.S. Cl.

CPC ........ *H04M 1/0264* (2013.01); *H10K 59/131* (2023.02); *H10K 59/122* (2023.02); *H10K 59/124* (2023.02); *H10K 59/8731* (2023.02); *H10K 77/10* (2023.02)

(58) Field of Classification Search

CPC .. H10K 59/131; H10K 50/844; H10K 59/122; H10K 59/124; H10K 77/10; H10K 59/8731; H10K 59/1213; H10K 59/00; H10K 59/65; H04M 1/0264; H04M 1/0266; H01L 27/1225; H01L 27/124; H01L 27/1248

USPC .......................................................... 257/40

See application file for complete search history.

(56) References Cited

U.S. PATENT DOCUMENTS

| | | | | |
|---|---|---|---|---|
| 11,782,477 | B2 * | 10/2023 | Jeon | G06F 1/1605 |
| 2017/0294502 | A1 | 10/2017 | Ka et al. | |
| 2020/0075692 | A1 * | 3/2020 | Park | H10K 59/35 |
| 2020/0227505 | A1 * | 7/2020 | Kim | H10K 59/80 |
| 2021/0320163 | A1 * | 10/2021 | Bang | H10K 59/131 |

FOREIGN PATENT DOCUMENTS

| | | | | |
|---|---|---|---|---|
| KR | 10-2017-0117291 A | 10/2017 | | |
| KR | 10-2019-0079828 A | 7/2019 | | |
| KR | 10-2020-0025916 A | 3/2020 | | |
| KR | 10-2020-0034902 A | 4/2020 | | |
| KR | 10-2020-0063377 A | 6/2020 | | |
| WO | WO-2020066011 A1 * | 4/2020 | | H01L 27/3276 |

* cited by examiner

*Primary Examiner* — Ori Nadav

(74) *Attorney, Agent, or Firm* — Birch, Stewart, Kolasch & Birch, LLP

(57) ABSTRACT

Discussed is a display device provided with a large effective area by minimizing a margin area around a camera hole in a structure in which the camera hole is formed in a display area. A bypass line module, which is formed in the same process as the process of forming a first thin-film transistor, and a light-emitting device disconnection module, which is formed in the same process as the process of forming a second thin-film transistor, are disposed around the camera hole so as to overlap each other.

15 Claims, 8 Drawing Sheets

FIG. 1

PAD
100
300
NA
AA
A
Bezel
Bezel
GIP
HE
CH
CPBE
Bezel
H

DISPLAY DEVICE

CROSS-REFERENCE TO RELATED APPLICATIONS

This application claims priority to Korean Patent Application No. 10-2020-0186848, filed on Dec. 29, 2020 in the Republic of Korea, the entire contents of which are hereby expressly incorporated by reference as if fully set forth herein into the present application.

BACKGROUND OF THE INVENTION

Field of the Invention

The present invention relates to a display device, and more particularly to a display device provided with a large effective area by minimizing a margin area around a camera hole in a structure in which the camera hole is formed in a display area.

Discussion of the Related Art

Recently, an organic light-emitting display device has been considered for a competitive application because it does not require a separate light source and enables realization of a compact device design and vivid color display.

Organic light-emitting display devices are applied to various display devices, such as televisions, smartphones, electronic books, monitors, and laptop computers. Further, the organic light-emitting display devices are used in combination with cameras to perform not only a function of displaying a screen but also a function of checking and editing a photographed image.

SUMMARY OF THE INVENTION

A demand for reduction in the size of a bezel area on the periphery of a display device has recently increased. To this end, there is a need to accommodate a camera in a display area.

In order to accommodate a camera in a display area, a camera hole corresponding to the position of the camera needs to be formed in a substrate. Because the camera hole is formed by removing a portion of the substrate and portions of components disposed thereon, it may enable permeation of moisture. Therefore, it is needed to sufficiently separate organic layers from the camera hole and to ensure disconnection between continuously disposed organic layers in a light-emitting device. In addition, in order to enable the normal transmission of signals to the light-emitting devices around the camera hole, it is needed to divert lines to areas around the camera hole so as to couple signals around the camera hole.

As described above, in a display device including a camera, a disconnection structure is formed in the state of being spaced apart from a camera hole by a predetermined distance, and lines are disposed outside the disconnection structure while bypassing the camera hole. However, areas occupied by the disconnection structure and the bypass lines are non-display areas, which can lead to the reduction of an effective area.

To address these issues, it is an object of the present invention to provide a display device provided with a large effective area by minimizing a margin area around a camera hole in a structure in which the camera hole is formed in a display area. In particular, a bypass line module and a light-emitting device disconnection module are formed so as to overlap each other in an area around the camera hole, whereby the entire display area outside the light-emitting device disconnection module is used to form a light-emitting device. Further, since the light-emitting disconnection module and the bypass line module are disposed such that the edges thereof are aligned with each other, it is possible to maximize the effective area of the display device.

A display device according to an embodiment of the present invention can include a substrate having a display area and a non-display area surrounding the display area, at least one camera hole formed in the display area, a bypass line module provided on the substrate within a first width area having a first width from the edge of the camera hole, a light-emitting device disconnection module disposed on the bypass line module so as to overlap the bypass line module within the first width area, and a light-emitting device provided at a portion of the display area other than the camera hole and the first width area.

A display device according to another embodiment of the present invention can include a first thin-film transistor stack including a polysilicon active layer on a substrate, a first protective film covering the first thin-film transistor stack, a second thin-film transistor stack including an oxide semiconductor active layer on the first protective film, at least one camera hole formed in the substrate, a bypass line module provided in the first thin-film transistor stack within a first width area having a first width from the edge of the camera hole, a light-emitting device disconnection module provided in the second thin-film transistor stack, the light-emitting device disconnection module being disposed on the bypass line module so as to overlap the bypass line module within the first width area, and a light-emitting device provided on the second thin-film transistor stack.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1 is a plan view of a display device according to an embodiment of the present invention;

DETAILED DESCRIPTION OF THE EMBODIMENTS

Figure 2:
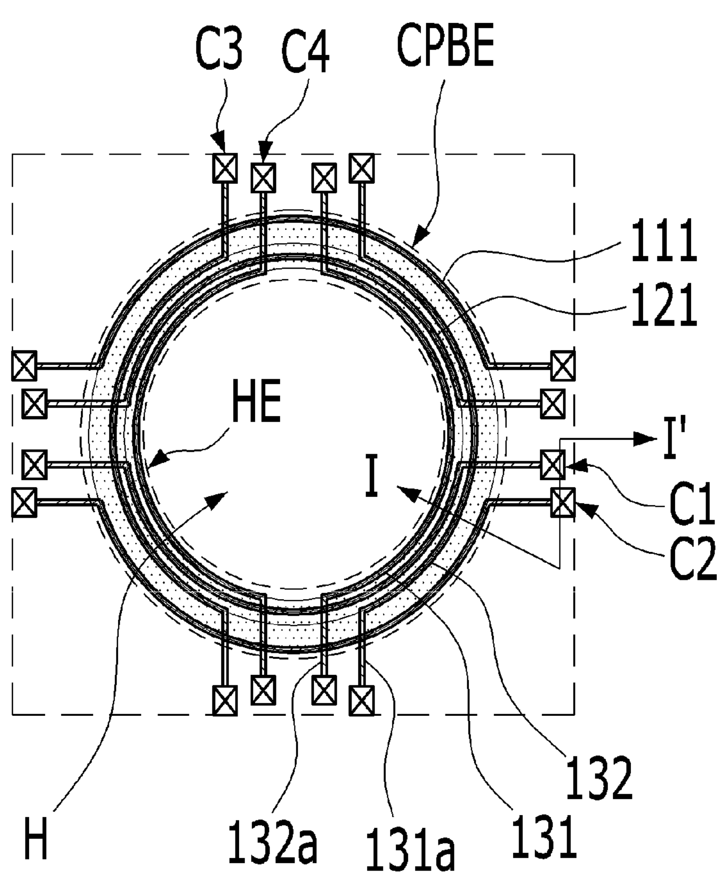
FIG. 2 is an enlarged view of the camera hole and the peripheral area thereof shown in FIG. 1.

Reference will now be made in detail to the exemplary embodiments of the present invention, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it can make the subject matter of the present invention rather unclear. Further, the names of elements used in the following description of the embodiments of the present invention are selected in consideration of ease of preparation of the specification, and can thus differ from the names of parts of an actual product.

The shapes, sizes, ratios, angles and numbers of elements given in the drawings to describe the embodiments of the present invention are merely exemplary, and thus, the present invention is not limited to the illustrated details. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless stated otherwise.

In the interpretation of elements included in the various embodiments of the present invention, it is to be interpreted that the elements include error ranges unless stated otherwise.

In the following description of the embodiments, it will be understood that, when positional relationships are expressed, for example, when an element is said to be "on", "above", "under" or "beside" another element, the two elements can directly contact each other, or one or more other elements can be interposed between the two elements, unless the term "just" or "directly" is used.

In the following description of the embodiments, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments, it will be understood that, when the terms "first", "second", etc. are used to describe various elements, these terms are used merely to distinguish the same or similar elements and may not define order. Therefore, a first element described hereinafter could be termed a second element without departing from the technical scope of the invention.

Respective features of the various embodiments of the present invention can be partially or wholly coupled to or combined with each other and be interlocked or driven in various technical manners, and the respective embodiments can be implemented independently of each other or be implemented together through connection therebetween.

Reference will now be made in detail to exemplary embodiments of the present invention, examples of which are illustrated in the accompanying drawings. All the components of each display device according to all embodiments of the present invention are operatively coupled and configured.

Figure 1:
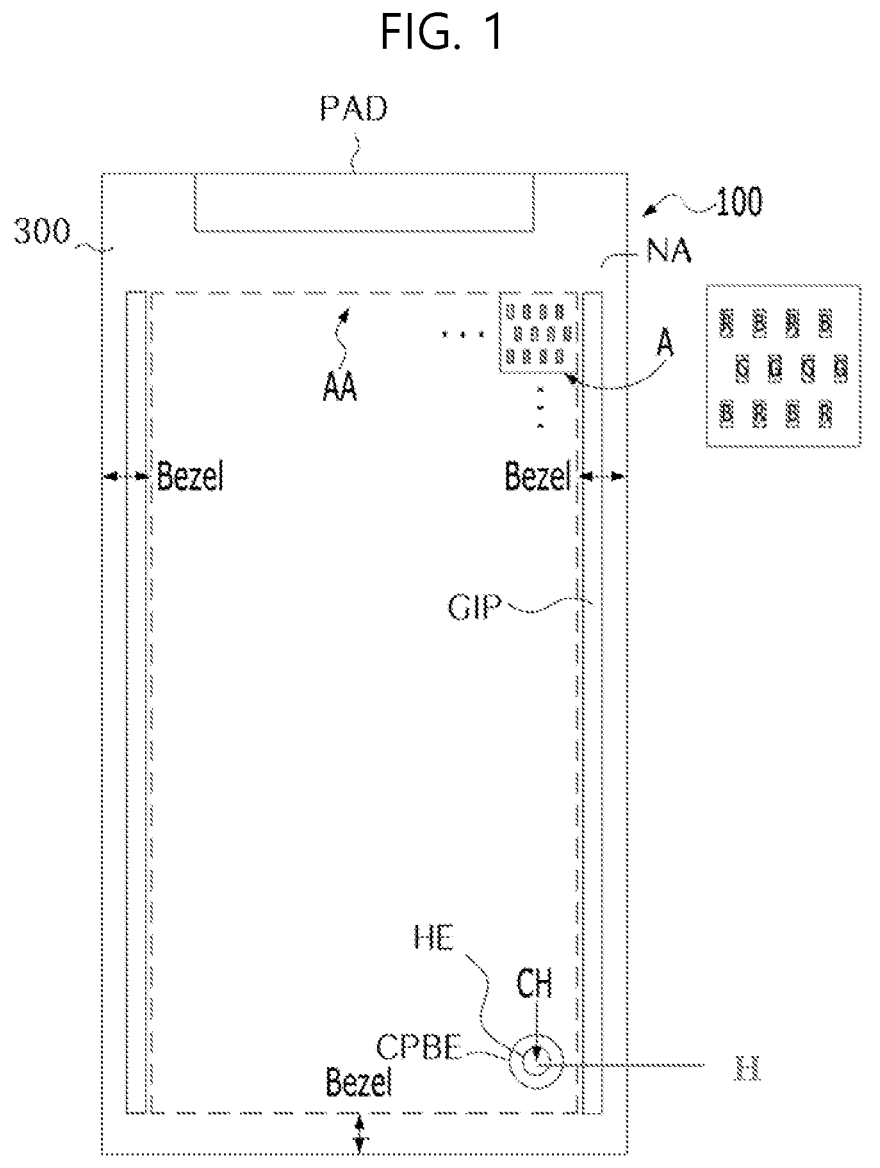

FIG. 1 is a plan view of a display device according to an embodiment of the present invention.

Referring to FIG. 1, the display device according to an embodiment of the present invention includes a substrate 100, which has a display area AA (an area defined by dotted lines) and a non-display area NA surrounding the display area, and at least one camera hole H (e.g., see FIG. 2), which is formed in the display area AA. The display device further includes a bypass line module LEU (e.g., see FIG. 6) and a light-emitting device disconnection module ELCU (e.g., see FIG. 8), which are disposed so as to overlap a composite module CPB (e.g., see FIG. 3), which is formed to have a first width from the edge of the camera hole H.

In addition, the display device according to the present invention further includes a light-emitting device OLED, which is provided at a portion of the display area AA other than the camera hole H and the composite module CPB.

Since the bypass line module LEU and the light-emitting device disconnection module ELCU overlap the composite module CPB, which is contiguous with the edge of the camera hole H, a non-effective area around the camera hole H precisely corresponds to the composite module CPB, so the effective area in the display area AA can increase.

The composite module CPB can have a first width 'a' (e.g., see FIG. 9) from the edge of the camera hole H. Here, the first width 'a' is approximately 500 μm. Accordingly, the display device according to the present invention is capable of reducing the non-effective area in the display area compared to a structure in which a light-emitting device disconnection module and a bypass line module are located at horizontally different positions.

The first width 'a' can be an important distance between the edge HE of the camera hole H and an end line CBPE of the composite module CPB.

The area occupied by the camera hole H and the composite module CPB can correspond to a camera module CM, which is provided under the substrate 100.

The camera module CM can include a camera lens and a camera bezel, which supports the camera lens and has a camera-driving unit.

In the display device according to the embodiments of the present invention, the composite module CPB can have the following meaning.

In order to minimize the bezel area on the periphery thereof, the display device can be configured such that the camera is provided in the display area AA. In this case, the camera hole H can be formed in the substrate 100 by removing the portion of the substrate and the portions of components disposed thereon that correspond to the camera. In order to prevent the influence of permeation of moisture through the camera hole on the display area, a light-emitting device necessarily requires a disconnection module around the camera hole. Further, because it is not possible to dispose lines horizontally or vertically over the area in which the camera hole is located, it is necessary to provide a bypass line module in a separate area so as to bypass the camera hole.

The disconnection module of the light-emitting device includes a plurality of insulation films, which are patterned so as to be separated from each other in a horizontal area. Thus, in a device in which a single thin-film transistor stack structure is provided on a substrate, a protective film for protecting the bypass line module needs to be formed on the entire surface thereof, thus making it difficult to arrange the bypass line module and the disconnection module of the light-emitting device so as to overlap each other.

The display device according to the embodiments of the present invention is structured such that thin-film transistors having different respective active layers have a multi-stack structure. The bypass line module is formed in a thin-film transistor stack including a polysilicon active layer, which is located at a lower side, and the light-emitting device disconnection module is formed in a thin-film transistor stack including an oxide semiconductor active layer, which is located at an upper side, whereby the bypass line module and the light-emitting device disconnection module are disposed so as to vertically overlap each other. For example, according to the display device of the present invention, the bypass line module and the light-emitting device disconnection module are formed so as to overlap each other in different respective stacking processes of the thin-film transistors, thereby minimizing the size of a dead zone in the display area.

The camera hole H can be formed through the substrate 100, and a camera lens CL can be inserted into the camera hole H. The camera lens CL can be located on a camera bezel BZ including a camera-driving unit.

An encapsulation structure 300 can cover at least a portion of the display area AA of the substrate 100 other than a pad unit PAD.

In addition, a gate-driving unit GIP, which is embedded in the substrate 100, can be located in the non-display area NA of the substrate 100. The gate-driving unit GIP can include a thin-film transistor, which includes a polysilicon active layer in a circuit constituting the gate-driving unit. In this specification, the thin-film transistor included in the gate-driving unit will be referred to as a "first thin-film transistor T1", and the detailed configuration thereof will be described with reference to cross-sectional views.

A plurality of pixels is provided in the display area AA, and each pixel includes a light-emitting device. The light-emitting device is connected to a driving thin-film transistor. The driving thin-film transistor includes a thin-film transistor having an oxide semiconductor as an active layer. In this specification, the driving thin-film transistor will be referred to as a "second thin-film transistor T2".

Each pixel can have a switching transistor for selective operation of the pixel, and the switching transistor can be formed in the same process as the process of forming the first thin-film transistor T1.

Hereinafter, the configuration of the area around the camera hole in the display device according to various embodiments of the present invention will be described in detail.

Figure 3:
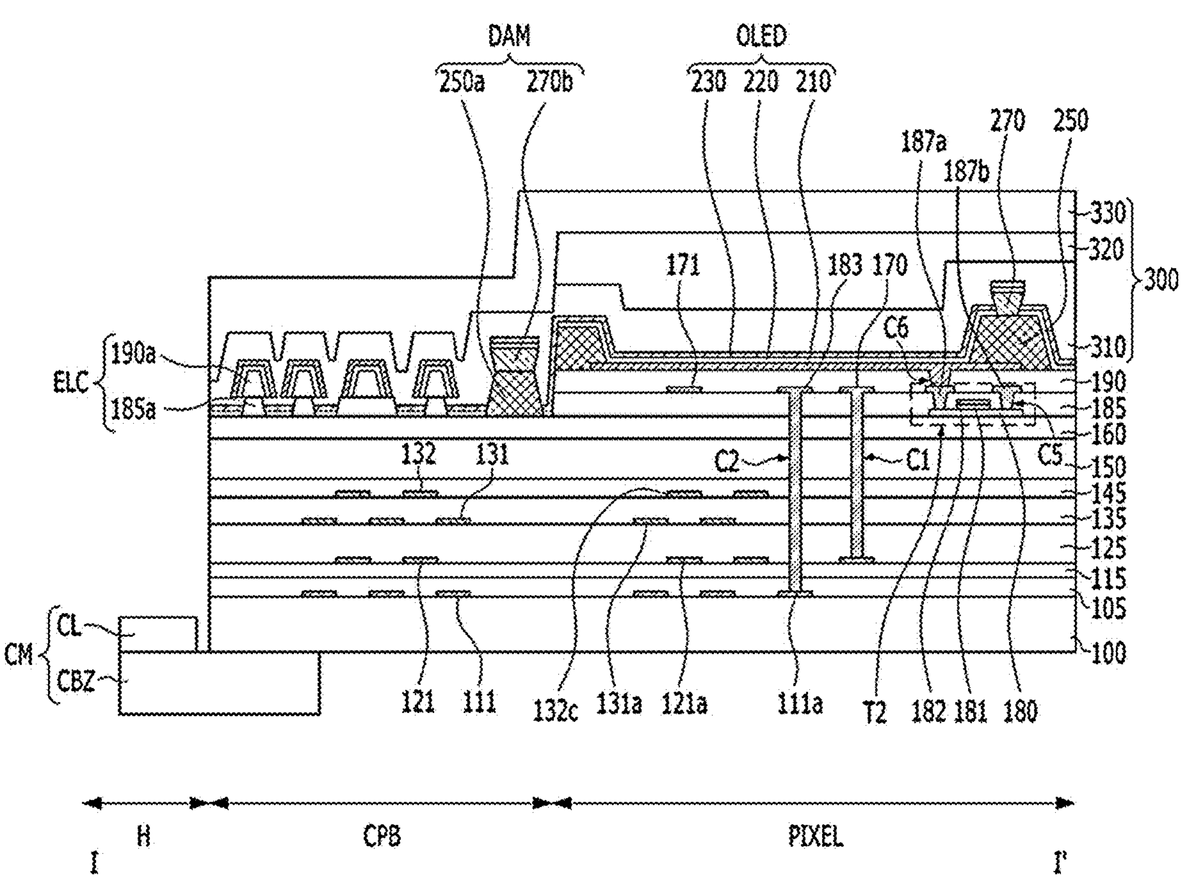
FIG. 3 is a cross-sectional view taken along line I-I' in FIG. 2.
Figure 5:
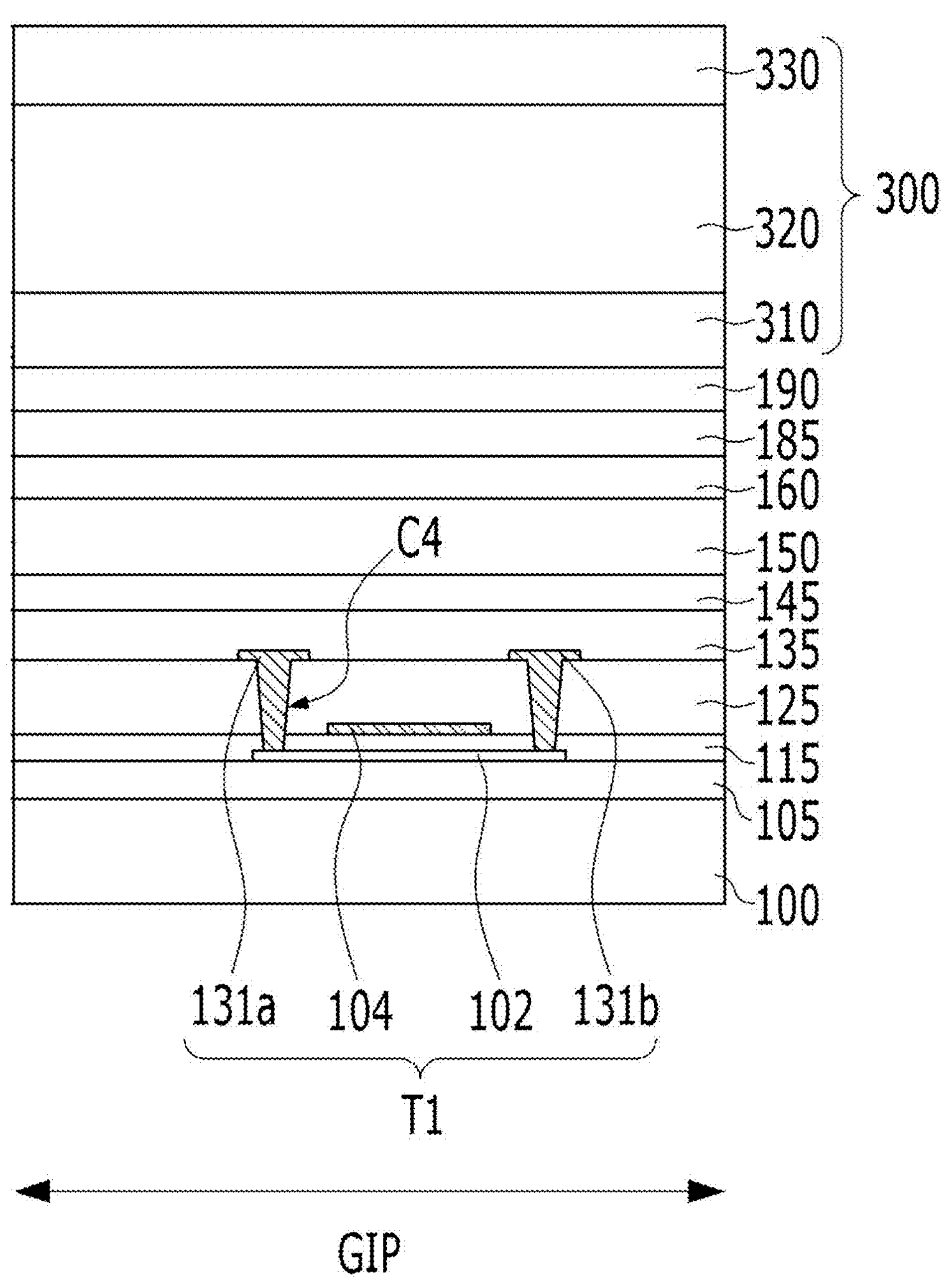
FIG. 5 is a cross-sectional view of the gate-driving unit shown in FIG. 1.

FIG. 2 is an enlarged view of the camera hole and the peripheral area thereof shown in FIG. 1, FIG. 3 is a cross-sectional view taken along line I-I' in FIG. 2, and FIG. is a cross-sectional view of a portion of the display device from the camera hole to a third contact hole. FIG. 5 is a cross-sectional view of the gate pad unit shown in FIG. 1, FIG. 6 is a plan view showing the bypass line module of the composite module, FIG. 7 is a plan view showing a contact hole adjacent to the composite module, and FIG. 8 is a plan view showing the light-emitting device disconnection module of the composite module.

Figure 6:
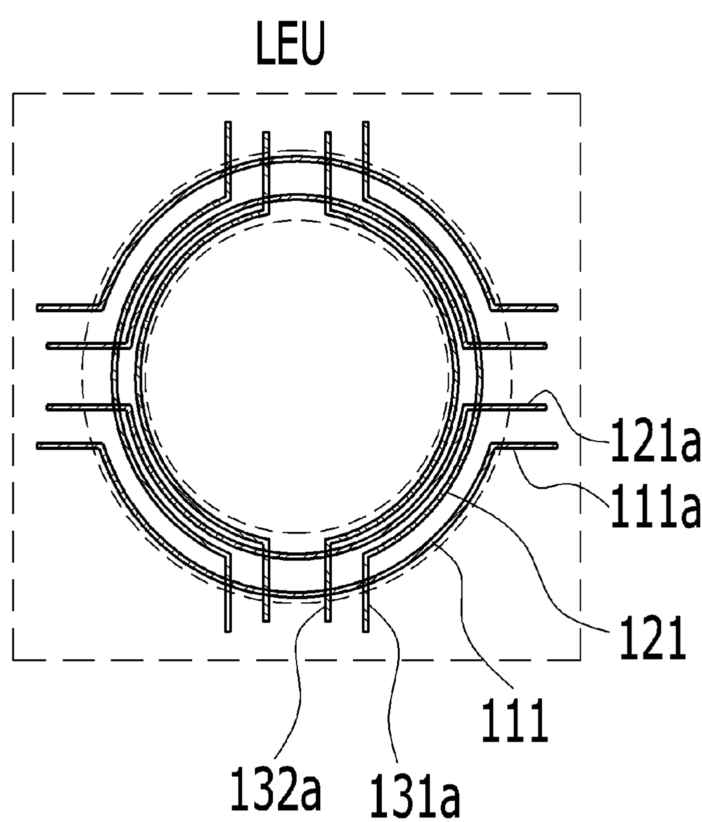
FIG. 6 is a plan view showing a bypass line module of a composite module according to an embodiment of the present invention.
Figure 7:
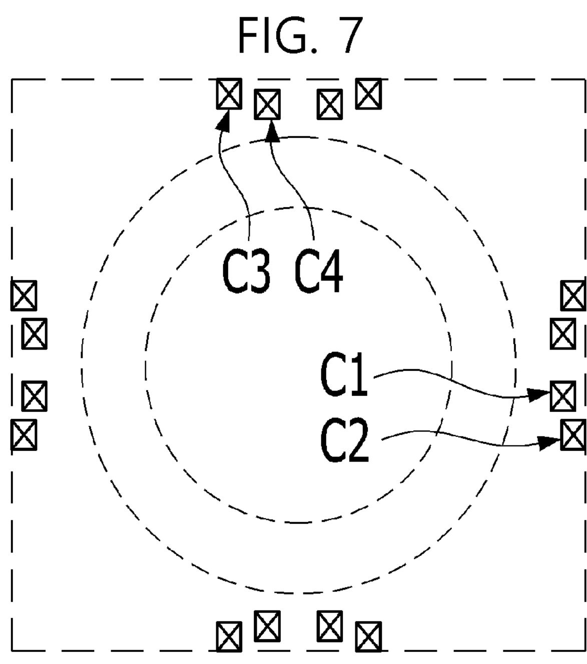
FIG. 7 is a plan view showing a contact hole adjacent to the composite module according to an embodiment of the present invention.
Figure 8:
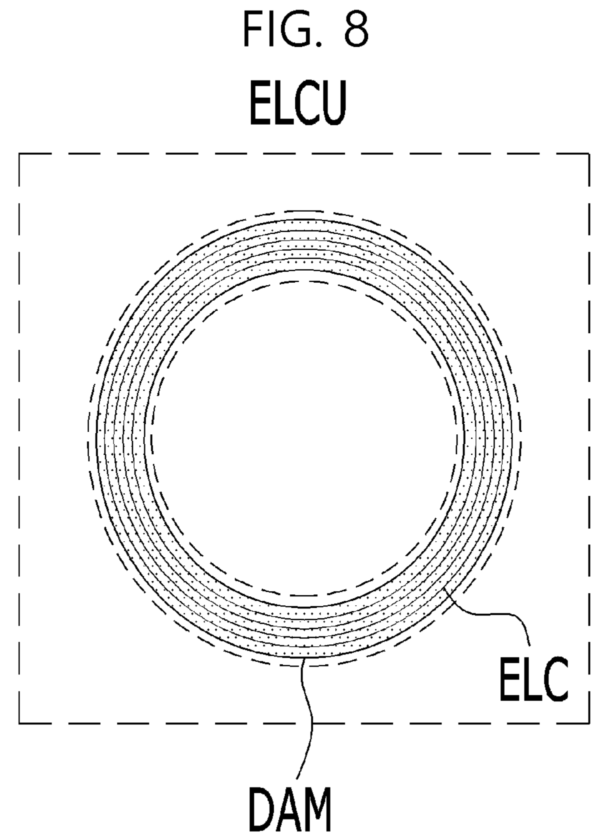
FIG. 8 is a plan view showing a light-emitting device disconnection module of the composite module according to an embodiment of the present invention.

In the display device according to one or more embodiments of the present invention, the composite module CPB has the bypass line module LEU of FIG. 6 and the light-emitting device disconnection module ELCU of FIG. 8, which overlap each other.

Specifically, the bypass line module is formed in the same process as the process of forming the first thin-film transistor T1, which is provided in the gate-driving unit GIP, as shown in FIGS. 2 to 5.

The first thin-film transistor T1 can include a first active layer 102, which is located on a first buffer layer 105 and is formed of polysilicon, a first gate electrode 104, which is located so as to overlap the first active layer 102, with a first gate insulation film 115 interposed therebetween, and first and second electrodes 131*a* and 131*b*, which are connected to respective sides of the first active layer 102.

In the embodiment, the first thin-film transistor T1 including polysilicon is illustrated as being provided only in the gate-driving unit GIP, but the embodiment is not limited thereto. When a plurality of thin-film transistors is included in the pixel PIXEL, a thin-film transistor other than the driving thin-film transistor can be formed so as to have the same first active layer and in the same process as the first thin-film transistor T1.

In order to prevent the generation of photocurrent due to light traveling from the substrate 100, a light-blocking layer can be further provided below the first active layer 102 of the first thin-film transistor T1. The light-blocking layer can be electrically isolated from at least a channel portion of the first active layer 102 by the first buffer layer 105.

A scan line 111*a* can be formed in the display area AA so as to be located in the same layer as the light-blocking layer. A first layer line 111 can be formed in the bypass line module LEU. The scan line 111*a* can be further provided in the pixel PIXEL.

A second layer line 121 can be formed in the bypass line module LEU so as to be located in the same layer as the first gate electrode 104, and an EM line 121*a* can be formed in the pixel PIXEL. The first layer line 111 and the second layer line 121 are laid in the same direction, and are formed in different layers so as to be adjacent to each other. Similarly, the scan line 111*a* and the EM line 121*a* are laid in the same direction, and are formed in different layers so as to be adjacent to each other. In some cases, when the pixel has an area sufficient to dispose the lines therein, the scan line 111*a* and the EM line 121*a* can be provided in the same layer.

As shown in FIG. 6, the first layer line 111 and the second layer line 121 can extend in the horizontal direction to pixels present outside the bypass line module LEU so as to function as the scan line 111*a* and the EM line 121*a*. Further, the scan line 111*a* and the EM line 121*a* can extend to the gate-driving unit GIP in the non-display area NA so as to receive signals.

A first interlayer insulation film 125 is provided between the first gate electrode 104 and the first and second electrodes 131*a* and 131*b*.

A third layer line 131 can be formed in the bypass line module LEU so as to be located in the same layer as the first and second electrodes 131*a* and 131*b*, and a first data line 131*c* can be formed in the pixel PIXEL.

As shown in FIG. 5, the gate-driving unit GIP is provided with a plurality of thin-film transistors to form a circuit. In order to increase the integration of the first thin-film transistors, the first and second electrodes 131*a* and 131*b* of one first thin-film transistor can be formed in different layers from those of another first thin-film transistor adjacent thereto.

A second data line 132*c* can be formed on a first planarization film 135, which covers the first data line 131*c*, so as to be adjacent to the first data line 131*c*. In the same manner, a fourth layer line 132 can be formed on the first planarization film 135 in the bypass line module LEU so as to be adjacent to the third layer line 131. The first data line 131*c* and the second data line 132*c* are located in the same vertical direction. The first and second data lines 131*c* and 132*c* can function not only as data lines but also as power voltage lines or reference voltage lines, which are disposed in the same direction as the data lines.

The first and second data lines 131*c* and 132*c* can be connected to the pad unit PAD provided in the non-display area, and can apply data voltage signals, power voltage signals, or reference voltage signals thereto.

The fourth layer line 132 and the second data line 132*c* can be covered and protected by a first protective film 145.

In addition, a second planarization film 150 is provided on the first protective film 145 in order to planarize the structure formed thereunder.

A second buffer layer 160 is formed on the second planarization film 150.

The second thin-film transistor T2 is disposed in the pixel PIXEL. The second thin-film transistor T2 includes a second active layer 180, which is located on the second buffer layer 160 and is formed of an oxide semiconductor, a second gate electrode 182, which is located so as to overlap the second active layer 180, with a second gate insulation film 181 interposed therebetween, and third and fourth electrodes 187*a* and 187*b*, which are connected to the second active layer 180, with a second interlayer insulation film 185 interposed therebetween.

Connection patterns 170, 183 and 172 can be formed in the same layer as the third and fourth electrodes 187*a* and 187*b* so as to be connected to the scan line 111*a*, the EM line 121*a*, the first data line 131*c*, and the second data line 132*c*, which correspond to the portions of the first to fourth layer lines 111, 121, 131 and 132 that extend to the pixel PIXEL.

A second protective film 190 can be provided on the second thin-film transistor T2 in order to protect the second thin-film transistor T2. An anode 210 of the light-emitting device OLED can be connected to the third electrode 187*a* of the second thin-film transistor T2 through a contact hole formed in the second protective film 190.

The light-emitting device disconnection module ELCU of the composite module CPB is formed in the process of forming the second thin-film transistor T2.

The light-emitting device disconnection module ELCU includes a first disconnection pattern 185*a*, which is formed in the same layer as the second interlayer insulation film 185, and a second disconnection pattern 190*a*, which is formed in the same layer as the second protective film 190.

As shown in FIGS. 2 to 8, the first disconnection pattern 185*a* can be formed through a patterning process when a fifth contact hole C5 for connection of the third and fourth electrodes 187*a* and 187*b* to the second active layer 180 is formed. As shown in FIG. 6, first to fourth contact holes C1, C2, C3 and C4, through which a portion of the scan line 111*a*, a portion of the EM line 121*a*, a portion of the first data line 131*c*, and a portion of the second data line 132*c* are respectively exposed, are formed in the same process as the process of forming the fifth contact hole C5.

Figure 4:
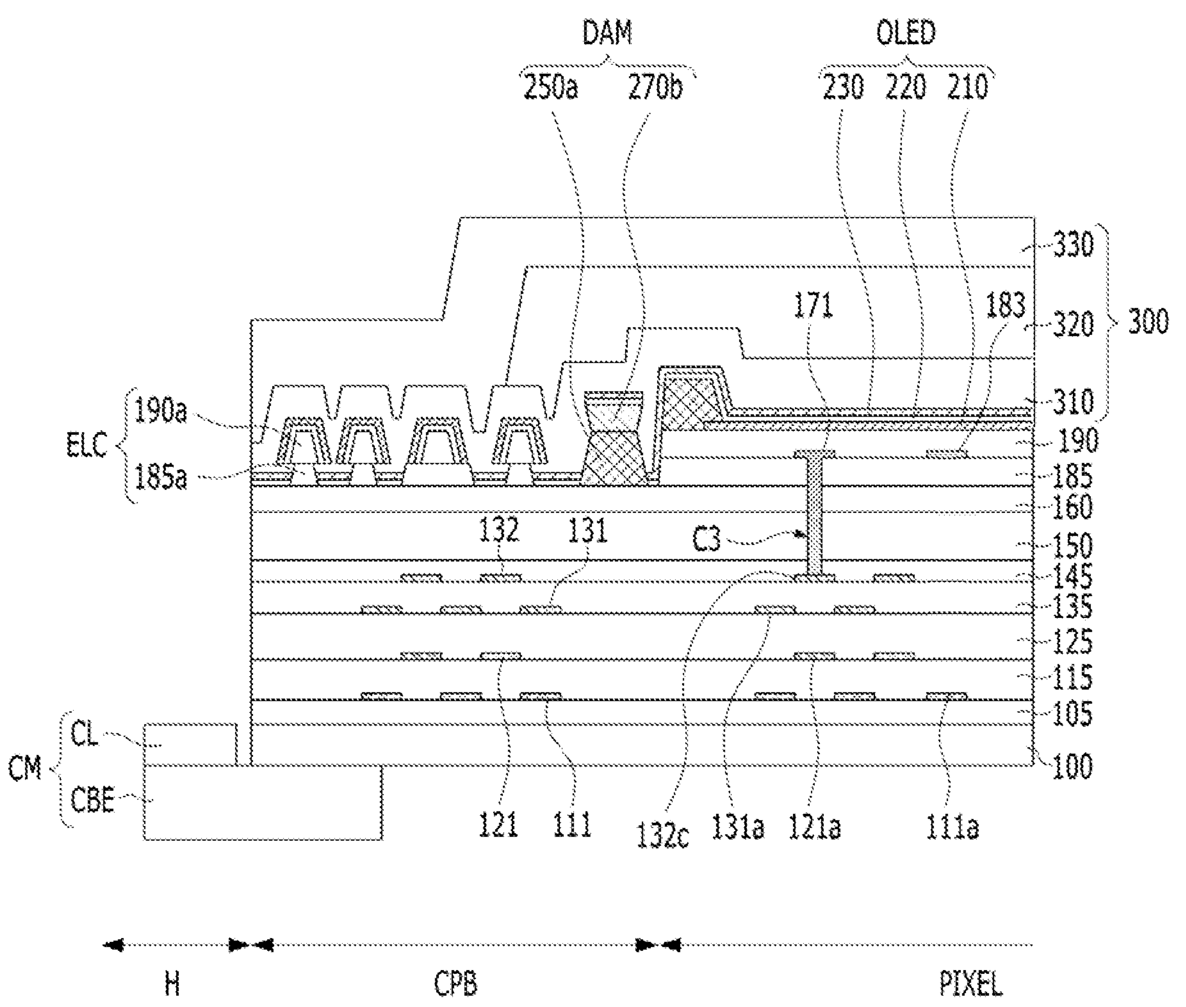
FIG. 4 is a cross-sectional view of a portion of the display device from the camera hole to a third contact hole according to an embodiment of the present invention.

The first contact hole C1 penetrates the second interlayer insulation film 185, the second buffer layer 160, the second planarization film 150, the first protective film 145, the first planarization film 135, and the first interlayer insulation film 125 shown in FIGS. 3 to 5, thereby exposing a portion of the EM line 111*a*.

The second contact hole C2 penetrates the second interlayer insulation film 185, the second buffer layer 160, the second planarization film 150, the first protective film 145, the first planarization film 135, the first interlayer insulation film 125, the first gate insulation film 115, and the first buffer layer 105 shown in FIGS. 3 to 5, thereby exposing a portion of the scan line 111*a*.

The third contact hole C3 penetrates the second interlayer insulation film 185, the second buffer layer 160, the second planarization film 150, the first protective film 145, and the first planarization film 135 shown in FIGS. 3 to 5, thereby exposing a portion of the first data line 131*c*.

The fourth contact hole C4 penetrates the second interlayer insulation film 185, the second buffer layer 160, the second planarization film 150, and the first protective film 145 shown in FIGS. 3 to 5, thereby exposing a portion of the second data line 132*c*.

The first to fourth contact holes C1, C2, C3 and C4 are located outside the composite module CPB. For example, according to the display device of the present invention, the first to fourth contact holes C1, C2, C3 and C4 are located so as to overlap the light-emitting device OLED, thereby increasing the effective area thereof.

The second disconnection pattern 190*a* can be formed through a patterning process when a sixth contact hole C6 for connection between the third electrode 187*a* and the anode 210 is formed in the second protective film 190.

The light-emitting device OLED includes an anode 210, an organic stack 220, and a cathode 230, which are sequentially stacked. The anode 210 is formed in each pixel PIXEL through a patterning process.

The organic stack 220 is formed such that a hole injection layer, a hole transport layer, an emission layer, an electron transport layer, and an electron injection layer are stacked. These layers can be formed through a deposition process using a common mask that opens the entirety of the display area AA. In some cases, the emission layer can be patterned using a fine metal mask that selectively opens an area corresponding to the emission part of each pixel PIXEL.

As described above, the common layers (e.g., the hole injection layer, the hole transport layer, the emission layer, the electron transport layer, and the electron injection layer) of the organic stack 220 and the cathode 230 are integrally formed using a common mask in at least the display area AA. However, in the display device of the present invention, since a portion of the substrate 100 is perforated to form the camera hole H, moisture can permeate thereinto. Because the organic stack 220, which is formed of an organic material, is vulnerable to moisture, the disconnection pattern ELC of the light-emitting device disconnection module ELCU of the complex module CPB is formed so as to block the moisture permeation path. The larger the number of disconnection patterns ELC, the more effective the blocking. The disconnection patterns ELC can be formed in accordance with the shape of the edge HE of the camera hole H. In this embodiment, the camera hole H can have a circular shape, and the disconnection patterns ELC can be formed along the edge HE of the camera hole H in the shape of concentric circles having different diameters. However, when the camera hole H has an elliptical or polygonal shape, the shape of the disconnection patterns ELC can be changed in accordance therewith.

The light-emitting device disconnection module ELCU can be further provided with a dam pattern DAM at a position close to the pixel PIXEL. The dam pattern DAM serves to prevent overflow of the material of an organic encapsulation film 320 in the encapsulation structure 300, which covers and protects the light-emitting device. The dam pattern DAM can also be provided in a plural number.

The dam pattern DAM can be formed together with a bank 250, which defines an emission part of the light-emitting device OLED. A spacer 270 can be formed on a portion of the bank 250 in order to prevent the bank 250 from directly contacting a deposition mask during a deposition process and to protect the surface of the bank 250. Further, the spacer 270 can be disposed between neighboring pixels PIXEL, thereby preventing lateral current leakage, which can occur in the case in which the organic stack 220 is commonly formed in the pixels PIXEL. An organic material is very straight at the time of deposition thereof. Therefore, when the spacer 270 is formed in an inverted tapered shape, almost no organic material is deposited on the inverted tapered side portion of the spacer 270, and thus the organic material is not continuously deposited over the pixels PIXEL, thereby making it possible to prevent lateral current leakage.

Here, the dam pattern DAM is formed such that a spacer pattern 270*b*, which is the same layer as the spacer 270, is stacked on a bank pattern 250*a*, which is the same layer as the bank 250, and thus has a height large enough to effectively prevent the organic encapsulation film 320 from overflowing to the complex module CPB.

The disconnection pattern ELC of the light-emitting device disconnection module ELCU of the present invention is formed such that the width of the first disconnection pattern 185*a* and the width of the second disconnection pattern 190*a* are different from each other at the interface therebetween, whereby, when the organic stack 220 is deposited on the sidewalls of the first and second disconnection patterns 185*a* and 190*a*, the organic stack 220 is discontinuous at the interface between the first and second disconnection patterns 185*a* and 190*a*. Specifically, the first disconnection pattern 185*a*, which is located under the second disconnection pattern 190*a*, has a smaller width than the second disconnection pattern 190*a* at the interface therebetween, thereby exhibiting an undercut effect, thus interrupting the continuity of the organic stack 220 on the sidewall of the disconnection pattern ELC.

The cathode 230 is formed on the organic stack 220 through a deposition process to be very thin, to a thickness of several hundreds of angstroms (Å). The continuity of the organic stack 220 and the cathode 230 are interrupted by the disconnection pattern ELC, the inverted tapered spacer 270, and the inverted tapered spacer pattern 270*b*. The discontinuity of the organic material in the composite module CPB functions to block the moisture permeation path, and the discontinuity of the organic material on the bank 250 in the pixel PIXEL functions to prevent lateral current leakage.

The encapsulation structure 300 can cover and protect the upper portion of the light-emitting device OLED. The encapsulation structure 300 can be formed not only in the light-emitting device OLED but also in the non-display area, such as the composite module CPB adjacent to the camera hole H and the gate-driving unit GIP.

The encapsulation structure 300 can be formed such that inorganic encapsulation films 310 and 330 and an organic encapsulation film 320 are alternately stacked. The organic encapsulation film 320 of the encapsulation structure 300 can be blocked by the dam pattern DAM, and thus may not be formed in the complex module CPB. For example, only the inorganic encapsulation films 310 and 330 of the encapsulation structure 300 can be provided in the composite module CPB.

In the above-described configuration, the first to fourth layer lines 111, 121, 131 and 132 can be formed of at least one of molybdenum, tungsten, copper, aluminum, silver, or titanium, or an alloy including any one of the same.

The first and second buffer layers 105 and 160, the first and second gate insulation films 115 and 181, and the first and second interlayer insulation films 125 and 185 can be inorganic films, such as oxide films, nitride films, or oxynitride films. Further, any one of the first and second buffer layers 105 and 160, the first and second gate insulation films 115 and 181, and the first and second interlayer insulation films 125 and 185 can have a multi-layered structure.

The first and second protective films 145 and 190 and the first and second planarization films 135 and 150 can be inorganic films or organic films. Although it is preferable for the first and second protective films 145 and 190 and the first and second planarization films 135 and 150 to be formed as organic films for the flatness of the surfaces thereof, the embodiment is not limited thereto. The first and second protective films 145 and 190 and the first and second planarization films 135 and 150 can be formed by stacking a plurality of inorganic films.

One of the anode 210 and the cathode 230 of the light-emitting device OLED can be a reflective electrode, and the other one thereof can be a transmissive electrode. When the anode 210 is a transmissive electrode, the lines 111*a*, 121*a*, 131*c* and 132*c*, which are located below the anode 210, can be disposed in a region in which the bank 250 is located, rather than a region in which the emission part is located.

The display device according to one or more embodiments of the present invention is configured such that the bypass line module is formed so as to have the same layered structure as the thin-film transistor including the polysilicon active layer and such that the light-emitting device disconnection module is stacked on the bypass line module. Accordingly, the non-effective area around the camera hole precisely corresponds to the single light-emitting device disconnection module. For example, the non-effective area around the camera hole is minimized.

In addition, the light-emitting device disconnection module is formed in the same process as the process of forming the layered structure of the thin-film transistor including the oxide semiconductor active layer and the process of forming the bank defining the emission part provided on the oxide semiconductor active layer. Accordingly, when the bypass line module and the light-emitting device disconnection module are formed so as to overlap each other, the formation is achieved without a separate process.

Figure 9:
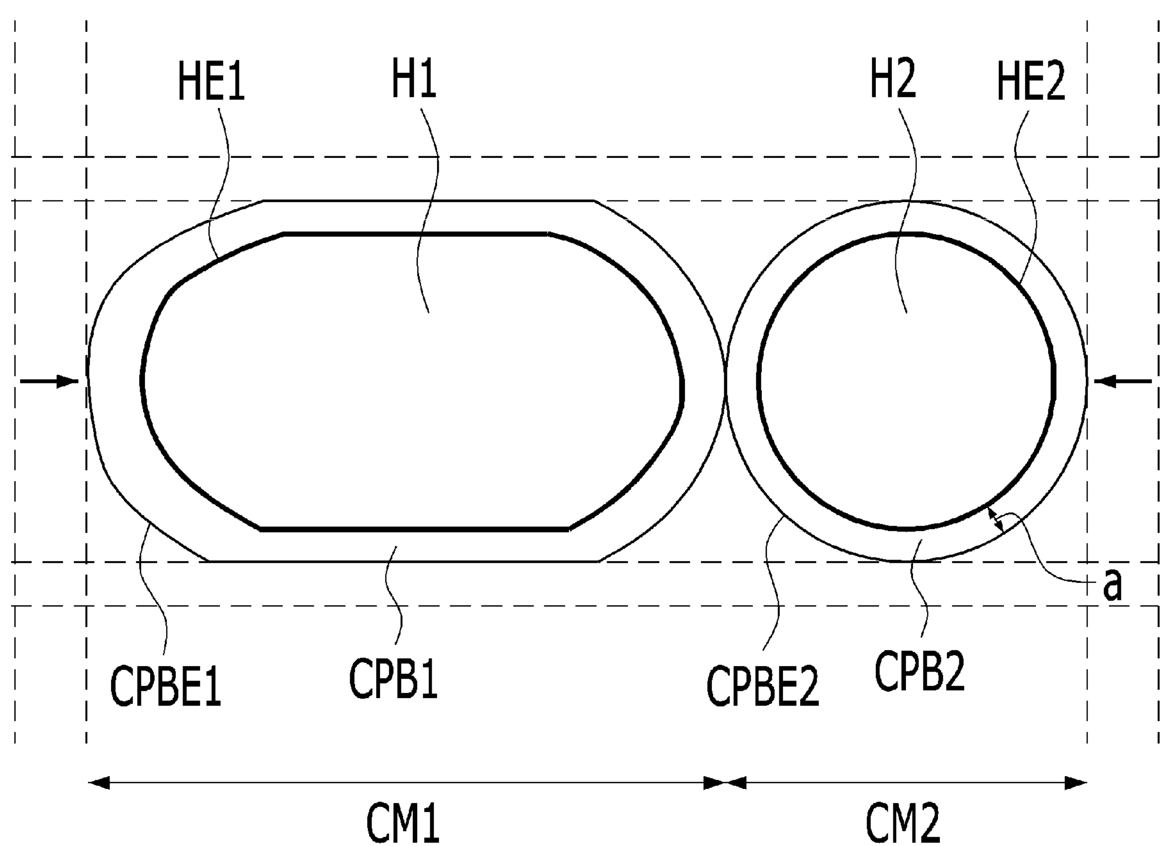
FIG. 9 is a plan view of a plurality of composite modules according to another embodiment of the present invention.

FIG. 9 is a plan view of a plurality of composite modules another embodiment of the present invention.

As shown in FIG. 9, a plurality of camera holes H1 and H2 can be provided. In this case, the camera holes H1 and H2 can have the same shape, or can have different respective sizes and different respective shapes, as shown in FIG. 9.

A first composite module CPB1, which includes a bypass line module and a light-emitting device disconnection module, and a second composite module CPB2, which includes a bypass line module and a light-emitting device disconnection module, are respectively disposed around the first camera hole H1 and the second camera hole H2. In order to reduce the size of a non-effective area, it is preferable that the end line CPBE1 of the first composite module CPB1 and the end line CPBE2 of the second composite module CPB2 be in contact with each other.

Here, the width of the second composite module CPB2 disposed around the second camera hole H2 can be equivalent to the first width ‘a’ described above.

As illustrated, in the case in which the first camera hole H1 has a larger horizontal width than the second camera hole H2, the number of data lines increases corresponding thereto, and accordingly the number of bypass data lines provided in the first composite module CPB1 is larger than that in the second composite module CPB2, so the widths of the left and right portions of the first composite module CPB1 can increase.

A first camera module CM1 can be provided in the area under the substrate that corresponds to the area occupied by the first camera hole H1 and the first composite module CPB1, and a second camera module CM2 can be provided in the area under the substrate that corresponds to the area occupied by the second camera hole H2 and the second composite module CPB2.

In the same manner as described above with reference to FIGS. 2 to 8, in the display device according to the embodiment shown in FIG. 9, a bypass line module LEU and a light-emitting device disconnection module ELCU are formed so as to overlap each other in each of the composite modules CPB1 and CPB2, pixels are formed outside the composite modules CPB1 and CPB2, and connection units for connection to lower lines are provided in the pixels. Since the light-emitting device disconnection module, which is required to prevent permeation of moisture, and the bypass line module, for securing an area to which lines are diverted, overlap each other, it is possible to maximize the size of the effective area of the display device.

A display device according to one embodiment of a present invention can comprise a substrate having a display area and a non-display area surrounding the display area, at least one camera hole in the display area, a bypass line module on the substrate within a first width area having a first width from an edge of the camera hole, a light-emitting device disconnection module on the bypass line module to overlap the bypass line module within the first width area and a light-emitting device at a portion of the display area other than the camera hole and the first width area.

The display device can further comprise a first protective film between an uppermost layer of the bypass line module and the light-emitting device disconnection module.

The display device can further comprise a first thin-film transistor on the first protective film in the display area. The first thin-film transistor can comprise a first active layer comprising an oxide semiconductor layer, a first gate electrode located to overlap the first active layer, with a first gate insulation film interposed therebetween and first and second electrodes connected to the first active layer, with a first interlayer insulation film interposed therebetween.

The light-emitting device disconnection module can comprise a plurality of disconnection patterns spaced apart from each other. Each of the plurality of disconnection patterns can comprise a first pattern formed at a same layer as the first interlayer insulation film and a second pattern formed on the first pattern, the second pattern having a width different from a width of the first pattern at an interface with the first pattern.

The light-emitting device can be provided on a planarization layer to cover the first thin-film transistor. The light-emitting device can comprise an anode connected to the first electrode of the first thin-film transistor through a first contact hole, an organic stack formed on the anode and a cathode formed on the organic stack. The organic stack can be spaced apart from the plurality of disconnection patterns and discontinuously formed between neighboring ones of the plurality of disconnection patterns.

The light-emitting device disconnection module can further comprise a dam pattern formed to be spaced apart from the plurality of disconnection patterns at a same layer as a bank defining an emission part of the light-emitting device.

The display device can further comprise a gate-driving unit at the non-display area of the substrate. The gate-driving unit can comprise a thin-film transistor formed under the first protective film. The thin-film transistor can comprise an active layer located at a vertical distance from the substrate shorter than the first active layer positioned on the first protective film, the active layer at the gate-driving unit comprising polysilicon, a second gate electrode located to overlap the active layer, with a second gate insulation film interposed therebetween and third and fourth electrodes connected to both sides of the active layer through second contact holes penetrating a second interlayer insulation film and the second gate insulation film.

The bypass line module can comprise a first line layer at a same layer as the second gate electrode and a second line layer at a same layer as the third electrode.

The display device can further comprise a first line at a same layer as the second gate electrode, a second line at a same layer as the third and fourth electrodes, a first connection pattern on the first interlayer insulation film, the first connection pattern overlapping a portion of the first line, a second connection pattern on the first interlayer insulation film, the second connection pattern overlapping a portion of the second line, a third contact hole between the first connection pattern and the first wire, the third contact hole penetrating the first interlayer insulation film, the first protective film, and the second interlayer insulation film and a fourth contact hole between the second connection pattern and the second wire, the fourth contact hole penetrating the first interlayer insulation film and the first protective film, at the portion of the display area other than the camera hole and the first width area.

The display device can further comprise an encapsulation structure formed on the light-emitting device and the light-emitting device disconnection module. The encapsulation structure can comprise an inorganic encapsulation film and an organic encapsulation film, the inorganic encapsulation film and the organic encapsulation film being alternately stacked. Only the inorganic encapsulation film of the encapsulation structure can be disposed on the light-emitting device disconnection module.

A display device according to another embodiment of a present invention can comprise a first thin-film transistor stack comprising a polysilicon active layer on a substrate, a first protective film covering the first thin-film transistor stack, a second thin-film transistor stack comprising an oxide semiconductor active layer on the first protective film, at least one camera hole at the substrate, a bypass line module provided in the first thin-film transistor stack within a first width having a first width from an edge of the camera hole, a light-emitting device disconnection module provided in the second thin-film transistor stack, the light-emitting device disconnection module on the bypass line module to overlap the bypass line module within the first width area and a light-emitting device on the second thin-film transistor stack.

The light-emitting device disconnection module can have a plurality of disconnection patterns formed parallel to an edge of the camera hole. The bypass line module can have a plurality of bypass lines disposed parallel to the edge of the camera hole, the plurality of bypass lines overlapping the plurality of disconnection patterns. The plurality of disconnection patterns and the plurality of bypass lines can be located within the first width area having the first width from the edge of the camera hole.

The first width can be 500 μm or less.

The second thin-film transistor stack can comprise an oxide semiconductor active layer, a first gate electrode located to overlap the oxide semiconductor active layer, with a first gate insulation film interposed therebetween and first and second electrodes connected to the oxide semiconductor active layer, with a first interlayer insulation film interposed therebetween.

The light-emitting device can be provided on a planarization layer covering the second thin-film transistor stack. The light-emitting device can comprise an anode connected to the first electrode through a first contact hole formed in the planarization layer, an organic stack formed on the anode and a cathode formed on the organic stack. The organic stack can be spaced apart from the plurality of disconnection patterns and discontinuously formed between neighboring ones of the plurality of disconnection patterns.

The light-emitting device disconnection module can further comprise a dam pattern to be spaced apart from the plurality of disconnection patterns at a same layer as a bank defining an emission part of the light-emitting device.

The display device can further comprise a gate-driving unit at a non-display area of the substrate. The gate-driving unit can comprise a second thin-film transistor under the first protective film, the second thin-film transistor having a same layered structure as the first thin-film transistor stack. The second thin-film transistor can comprise the polysilicon active layer, a second gate electrode located to overlap the polysilicon active layer, with a second gate insulation film interposed therebetween and third and fourth electrodes connected to both sides of the polysilicon active layer through a contact hole penetrating a second interlayer insulation film and the second gate insulation film.

As is apparent from the above description, the display device according to the present invention has the following effects.

First, the bypass line module is formed so as to have the same layered structure as the thin-film transistor including the polysilicon active layer, and the light-emitting device disconnection module is stacked on the bypass line module. Accordingly, the non-effective area around the camera hole precisely corresponds to the single light-emitting device disconnection module. For example, the size of the non-effective area around the camera hole is minimized.

Second, the light-emitting device disconnection module is formed in the same process as the process of forming the layered structure of the thin-film transistor including the oxide semiconductor active layer and the process of forming the bank defining the emission part provided on the oxide semiconductor active layer. Accordingly, when the bypass line module and the light-emitting device disconnection module are formed so as to overlap each other, the formation is achieved without a separate process.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display device comprising:
a first thin-film transistor stack comprising a polysilicon active layer on a substrate;
a first protective film covering the first thin-film transistor stack;
a second thin-film transistor stack comprising an oxide semiconductor active layer over the first protective film, a first gate electrode disposed to overlap the oxide semiconductor active layer, a first gate insulation film between the oxide semiconductor active layer and the first gate electrode, and a first electrode and a second electrode connected to the oxide semiconductor active layer, with a first interlayer insulation film interposed therebetween;
at least one camera hole at the substrate;
a bypass line module comprising a plurality of metal lines of the first thin-film transistor stack within a first width area having a first width from an edge of the at least one camera hole;
a light-emitting device disconnection module comprising at least two insulating films of the second thin-film transistor stack, the light-emitting device disconnection module over the bypass line module to overlap the bypass line module within the first width area; and
a light-emitting device over the second thin-film transistor stack, the light emitting device at a portion of a display area other than the at least one camera hole and the first width area,
wherein the polysilicon active layer is disposed under the first protective film, and the oxide semiconductor active layer, the first gate insulation film, the first gate electrode, the first electrode, the second electrode and the first interlayer insulating film are disposed above the first protective film, and
wherein the light-emitting device disconnection module comprises a plurality of disconnection patterns spaced apart from each other, and at least two insulating films of each of the plurality of disconnection patterns have different widths at an interface.

2. The display device according to claim 1, wherein the plurality of disconnection patterns are parallel to the edge of the at least one camera hole,
wherein the bypass line module has a plurality of bypass lines disposed parallel to the edge of the at least one camera hole, the plurality of bypass lines overlapping the plurality of disconnection patterns, and
wherein the plurality of disconnection patterns and the plurality of bypass lines are disposed within the first width area from the edge of the at least one camera hole.

3. The display device according to claim 1, wherein the first width is about 500 μm or less.

4. The display device according to claim 1, wherein the light-emitting device is provided on a planarization layer that covers the second thin-film transistor stack,
wherein the light-emitting device comprises:
an anode connected to the first electrode through a first contact hole in the planarization layer;
an organic stack on the anode; and
a cathode on the organic stack, and
wherein the organic stack is spaced apart from the plurality of disconnection patterns and discontinuously formed between neighboring ones of the plurality of disconnection patterns.

5. The display device according to claim 4, wherein the light-emitting device disconnection module further comprises a dam pattern to be spaced apart from the plurality of disconnection patterns coplanar with a bank defining an emission part of the light-emitting device.

6. The display device according to claim 1, further comprising:
a gate-driving unit at a non-display area of the substrate,
wherein the gate-driving unit comprises the first thin-film transistor stack under the first protective film, and wherein the first thin-film transistor stack comprises:

the polysilicon active layer;

a second gate electrode disposed to overlap the polysilicon active layer, with a second gate insulation film interposed therebetween; and one of a third electrode and a fourth electrode connected to sides of the polysilicon active layer through a contact hole penetrating a second interlayer insulation film and the second gate insulation film, and wherein the polysilicon active layer, the second gate electrode, the third electrode, the fourth electrode and the second gate insulating film are under the first protective film.

7. The display device according to claim 1, wherein an organic stack of the light-emitting device is disconnected between adjacent two disconnection patterns of the plurality of disconnection patterns.

8. The display device according to claim 1, wherein each of the plurality of disconnection patterns entirely encircles the at least one camera hole.

9. The display device according to claim 1, wherein the plurality of disconnection patterns are concentric about the at least one camera hole.

10. The display device according to claim 1, wherein each of the plurality of disconnection patterns comprises:

a first disconnection pattern including the first interlayer insulation film; and a second disconnection pattern on the first disconnection pattern, the second disconnection pattern having a second width different from a first width of the first disconnection pattern at an interface where the second disconnection pattern contacts with the first disconnection pattern.

11. The display device according to claim 1, wherein the light-emitting device is provided on a planarization layer to cover the second thin-film transistor stack, wherein the light-emitting device comprises:

an anode connected to the first electrode of the second thin-film transistor stack through a first contact hole;

an organic stack on the anode; and a cathode on the organic stack, and wherein the organic stack is spaced apart from the plurality of disconnection patterns and discontinuously formed between neighboring ones of the plurality of disconnection patterns.

12. The display device according to claim 1, wherein the light-emitting device disconnection module further comprises a dam pattern disposed to be spaced apart from the plurality of disconnection patterns and coplanar with a bank defining an emission part of the light-emitting device.

13. The display device according to claim 6, wherein the bypass line module comprises:

a first layer line coplanar with the second gate electrode; and a second layer line coplanar with the third electrode.

14. The display device according to claim 6, further comprising, at the portion of the display area other than the at least one camera hole and the first width area:

a first line coplanar with the second gate electrode;

a second line coplanar with the third and fourth electrodes;

a first connection pattern on the first interlayer insulation film, the first connection pattern overlapping a portion of the first line;

a second connection pattern on the first interlayer insulation film, the second connection pattern overlapping a portion of the second line;

a third contact hole between the first connection pattern and the first line, the third contact hole penetrating the first interlayer insulation film, the first protective film, and the second interlayer insulation film; and a fourth contact hole between the second connection pattern and the second line, the fourth contact hole penetrating the first interlayer insulation film and the first protective film.

15. The display device according to claim 1, further comprising:

an encapsulation structure on the light-emitting device and the light-emitting device disconnection module, wherein the encapsulation structure comprises an inorganic encapsulation film and an organic encapsulation film, the inorganic encapsulation film and the organic encapsulation film being alternately stacked, and wherein only the inorganic encapsulation film of the encapsulation structure is disposed on the light-emitting device disconnection module.

* * * * *